US006785615B2

(12) United States Patent
Scaman

(10) Patent No.: US 6,785,615 B2
(45) Date of Patent: Aug. 31, 2004

(54) METHOD AND STRUCTURE FOR DETECTION OF ELECTROMECHANICAL PROBLEMS USING VARIANCE STATISTICS IN AN E-BEAM LITHOGRAPHY DEVICE

(75) Inventor: Michael Edward Scaman, Goshen, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/284,510

(22) Filed: Oct. 29, 2002

(65) Prior Publication Data

US 2004/0079896 A1 Apr. 29, 2004

(51) Int. Cl.[7] ............... G01N 31/00; G01N 23/00; G01N 21/00; G06F 19/00
(52) U.S. Cl. ............... 702/27; 250/306; 250/307; 250/310; 250/311; 250/491.1; 250/492.2
(58) Field of Search ............... 702/27; 708/520; 250/306, 307, 310, 311, 491.1, 492.2

(56) References Cited

U.S. PATENT DOCUMENTS

| | | | | |
|---|---|---|---|---|
| 4,430,571 A | * | 2/1984 | Smith et al. ............... | 250/492.2 |
| 4,467,211 A | * | 8/1984 | Smith et al. ............... | 250/492.2 |
| 5,563,809 A | * | 10/1996 | Williams et al. ............... | 702/84 |
| 6,349,265 B1 | * | 2/2002 | Pitman et al. ............... | 702/27 |
| 6,408,321 B1 | * | 6/2002 | Platt ............... | 708/520 |
| 6,414,752 B1 | * | 7/2002 | Sullivan et al. ............... | 356/237.5 |
| 2001/0035748 A1 | * | 11/2001 | Guidotti et al. ............... | 324/73.1 |
| 2001/0053243 A1 | * | 12/2001 | Norioka et al. ............... | 382/145 |
| 2002/0154296 A1 | * | 10/2002 | Sullivan et al. ............... | 356/237.2 |

* cited by examiner

*Primary Examiner*—Nikita Wells
*Assistant Examiner*—Mary El-Shammaa
(74) *Attorney, Agent, or Firm*—Jay H. Anderson; Daryl K. Neff

(57) ABSTRACT

An apparatus and method for detection of electromechanical and mechanical errors in an electron beam device is provided. First the existing subfield is divided into a gridlike structure where each grid can be considered a target. Then a plurality of target points are provided on each grid for measuring combined directional variances. The separated horizontal and vertical variances is also measured for each of the target points. This leads to the performance of a significance tests, based on the F statistic which we refer to as $F_{HV}$, for horizontal and vertical values of each target points during which $F_{STITCH}$ values are also obtained. The $F_{STITCH}$ values are then compared for horizontal and vertical values and an error alert provided when there is a sufficiently large disparity between the separated $F_{STITCH}$ values. In an alternate embodiment of the present invention, a three dimensional grid is also provided to be used in a similar manner. The severity of the error can also be determined based on the disparity of the values. Lastly we refer to a simple F statistic for testing for flatness of the entire field, based on row and field information and refer to it as $F_{ROWS}$.

20 Claims, 5 Drawing Sheets

| Pattern type | type=7 FAB | | | | | | |
|---|---|---|---|---|---|---|---|
| Collect type | type=4CNRYX | | | | | | |
| Learn Quality | failure | | | | | | |
| Toolid | 0 | | | | | | |
| Deflection Name | EL5CLONE | | | | | | |
| Last deflection | Learned | | | | | | |
| Feedback LBS | 13.000000 | | | | | | |
| Collect Number | 10057 | | | | | | |
| Collect Date | 05/22/2002 | | | | | | |
| Collect time | 17:47:58 | | | (microns) | | (microns) | |
| | Raw Data | Type/Range | XAxis | Quality | YAxis | Quality | |
| | | std dev (nm) | 3.433 | | 6.832 | | Good |
| | | field avg | 0.109 | needs learn | 0.093 | needs learn | |
| B Cycle | +-25.00nm | narrow range | 0.022 | good | 0.009 | good | |
| | +-100.00nm | wide range | 0.003 | good | 0.000 | good | |
| | | missing | 0.012 | needs learn | 0.000 | good | |
| | | std dev LR | 3.346 | | 4.289 | | |
| | Stich Data | std dev TB | 3.735 | | 5.117 | | |
| | +- 7.00nm | narrow range | 0.828 | good | 0.000 | good | |
| | +- 22.00nm | wide range | 0.013 | good | 0.000 | good | |

FIG. 4

METHOD AND STRUCTURE FOR DETECTION OF ELECTROMECHANICAL PROBLEMS USING VARIANCE STATISTICS IN AN E-BEAM LITHOGRAPHY DEVICE

FIELD OF THE INVENTION

This invention relates generally to making of masks for semiconductor use and more particularly to calibration of an electron beam tool used in writing to a substrate.

BACKGROUND OF THE INVENTION

In today's fabrication of Integrated Circuits (IC) and other semiconductor devices, lithographic delineation procedures are used to yield positive or negative images to bring about selective processing, e.g. etching, implantation, diffusion, deposition, etc. This is especially true in fabrications of masks where the fabrication tool provides Blocking regions and Transparent regions which when illuminated by electron radiation yields an image defined by relatively low and high electron intensities, respectively. A Blocking region is usually defined as the mask region resulting in a degree of electron attenuation in the image which is of consequence in device fabrication. By contrast, a Transparent region is the mask region resulting in a degree of electron attenuation in the image which is small relative to blocking regions in terms of device fabrication.

In the semiconductor industry, there is a continuing trend toward an increased device density. To achieve this, there is a continued effort towards the scaling down of device dimensions on semiconductor wafers. As smaller feature sizes become the new requirements (i.e. decreased width and spacing of interconnecting lines, etc.), new ways have to be utilized to achieve their manufacturing. High resolution lithographic processes are used as one of these manufacturing techniques to yield small component features.

In general, lithography refers to processes for pattern transfer between various media. In lithography for integrated circuit fabrication, a silicon slice, the wafer, is coated uniformly with a radiation-sensitive film, the resist. The film is then selectively exposed to radiation, such as optical light, x-rays, or an electron beam, through an intervening master template or the mask, forming a particular pattern. (In a mask, this leads to the creation of Blocking and Transparent regions which when illuminated by electron radiation yields an image defined by relatively low and high electron intensities, respectively.)

Most often exposed areas of the coating become either more or less soluble than the unexposed areas (depending on the type of coating) in a particular solvent developer. The more soluble areas are removed with the developer in a developing step, the less soluble areas remain on the silicon wafer forming a patterned coating. The pattern corresponds to the image of the mask or its negative. The patterned resist is used in further processing of the silicon wafer.

At various stages in forming the patterned resist coating and processing the silicon wafer, it is desirable to measure critical dimensions resulting from the lithographic process. Critical dimensions can include the size of features in the wafer or patterned resist such as line widths, line spacing, and contact dimensions. Several calibration methods are developed and can be used such as scanning electron microscopy (SEM) systems.

In such calibration system, because of the super fine structures to be calibrated, an electron beam is often scanned across the sample. The beam interacts with the sample to produce measurable responses that vary with position over the course of a scan. There are several other ways to check for accuracy as well to ensure image precision at a later time.

One of the methods used historically by the E beam lithography tools is one that involves checking for stitch errors in determining more important underlying errors. This is often done by comparing the measurement of 4 corners of a target taken in a grid like subfield and comparing it with the measurement of the same corners taken from adjacent subfields. The values are usually then compared against a narrow and wide range for functional purposes. There are several problems with this approach, however. For one, the narrow range is easily exhaustible (exceeded), which makes continuous testing difficult. Second, this approach leaves much information uncovered which may mean that certain electromechanical system errors can go undetected. In order to make this approach more reliable, sometimes an operator has to be dispatched to visually and continuously monitor the testing which adds both inconvenience and cost to the functioning of the test. Therefore, an improved method and structure is needed to detect electromechanical problems in an automated manner and with more reliability

SUMMARY OF THE INVENTION

These and other objects are provided by the present invention for an apparatus and method for detection of electromechanical and mechanical errors in an electron beam device. First, a gridlike subfield is provided where each grid can be considered a target subfield. Then, a plurality of target points on each target subfield is indicated and the combined variance of displacement of target points on each target subfield is calculated to nominal position of the target subfield. Later, the combined target subfields stitching standard deviation or variance is also calculated by determining separation of each target point in each subfield with that of overlapping target points on the adjacent subfields. Variance statistics based on the sample variance of all measurements done in the field, variance statistics based on of measurements on a particular row and variance statistics based on differences between horizontally and vertically stitched measurements are made.

A stitched measurement is a measurement made on a particular target two different ways: in this case, the same measurement made two times on two different raster scans. Ratios of these variances can be used to form significance tests related to analysis of variance (ANOVA) and in the form of F statistics, and are well known in statistical literature. A significance test is then conducted using data from the variances derived from adjacent sets of horizontal and vertical values of said target points resulting in calculation of separated vertical and horizontal $F_{STITCH}$ values. When an F statistic, such as $F_{STITCH}$ is greater than some threshold, it indicates statistical significance where significance tables for the F statistics are readily available in the literature for threshold selection depending on an acceptable overkill rate known in the literature as alpha significance. By comparing $F_{STITCH}$ values for horizontal and vertical values to some threshold greater than one, an error alert can be provided when $F_{STITCH}$ values exceed that threshold. The horizontal statistic and vertical statistics may be used to indicated isotropy or anisotropy. Lastly, a general F statistic based on average row variance and the variance over the entire field variance may be used as one indication of an electromechanical disturbance in raster scanned data, particularly in an E beam system.

BRIEF DESCRIPTION OF THE DRAWINGS

FIG. 4 is an illustration of a statistical example of a particular data collect used in the present invention;

DETAILED DESCRIPTION OF THE PREFERRED EMBODIMENTS

The present invention provides a method and structure for detecting electromechanical errors. A quasi F-statistical test (ratio of variances) is provided in the present invention to determine the sources of error in the electron beam systems, tools and devices. A simple test which can easily be automated can be designed to provide such detection, as will be described below. This simple test not only will be able to detect simple failure in E beam due to mechanical problems but it can also detect a variety of other electromechanical related problems as well.

Figure 1:
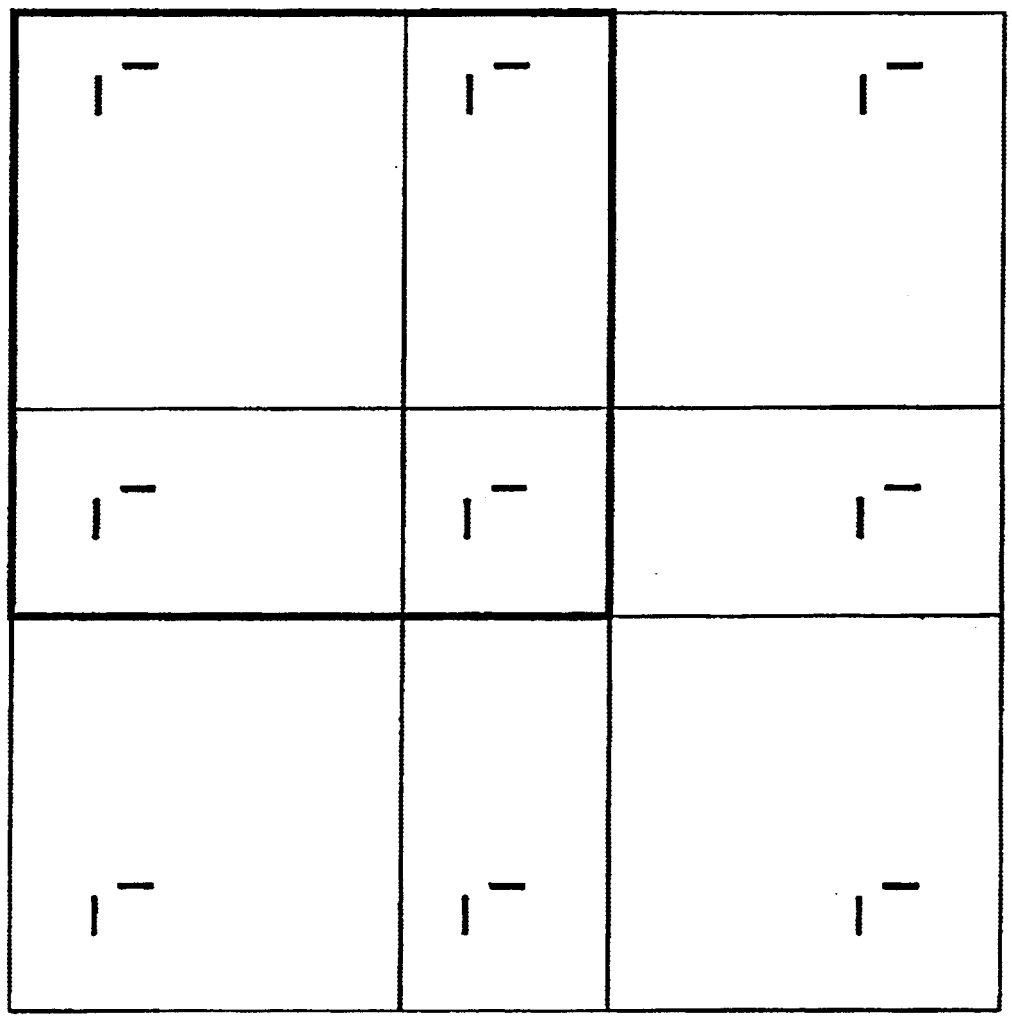
FIG. 1 is an illustration of a gridlike subfield where the targets are located.
Figure 2:
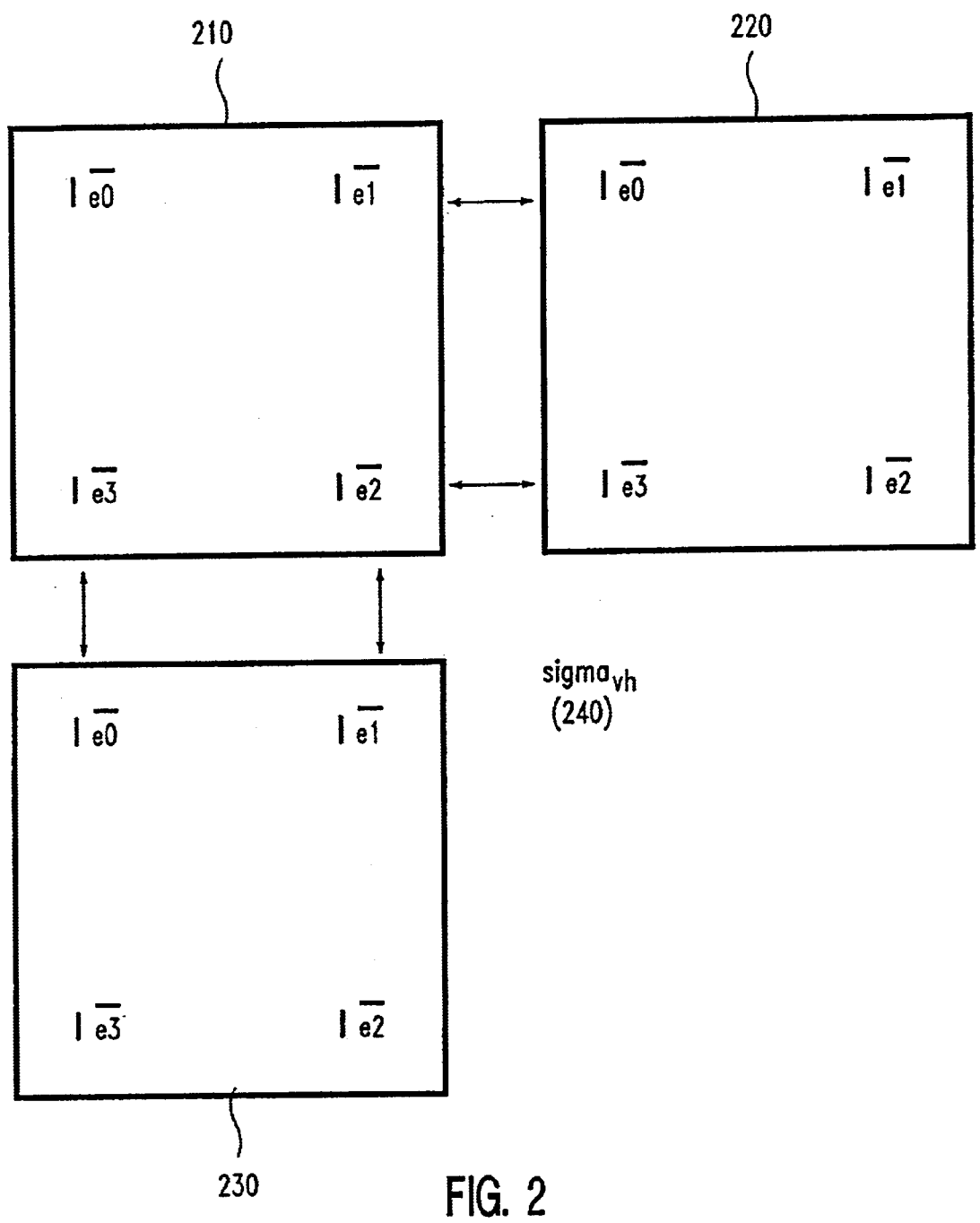
FIG. 2 is an illustration of the calculation of combined vertical/horizontal variance ($Var_{HV}$) from adjacent targets.

FIG. 1 is an illustration of a subfield grid with targets. These targets can be observed in greater detail in FIG. 2. To start, a set of variance statistics and measurements can be obtained. One combined variance of all measurements can be easily formed and identified as shown in FIG. 2 as: e0 (shown at 200), e1 (201), e2 (202), e3 (203). The combined horizontal/vertical variance as an F statistic is also shown in FIG. 2 at 240 and associated standard deviation identified as std $dev_{LR}$ (for the left-right horizontal stitch case and std $dev_{TB}$ for the vertical stitch case. (In general the conventional sampled variance of the set of the measurements will be referred to herein on after as var and the associated square root as "std dev", the standard deviation). In addition to $Var_{HV}$ several other directional variances will also be introduced. Note, that as first step, the variance(s) should be formed using the differences of the four measurements—horizontal and vertical—as shown in FIG. 2 and across all points in the field. The combined horizontal and vertical variance ($Var_{HV}$) is the variance of the set comprised of all differences between the e1 points in FIG. 2 and their left neighbor; all differences between all the e2 points and their left neighbor (including the differences between all points e2 and their lower adjacent neighbor); and all points e3 and their lower adjacent neighbor. Therefore, the square root of variance is simply $StdDev_{HV}$ which is the combined horizontal and vertical statistics.

Figure 3:
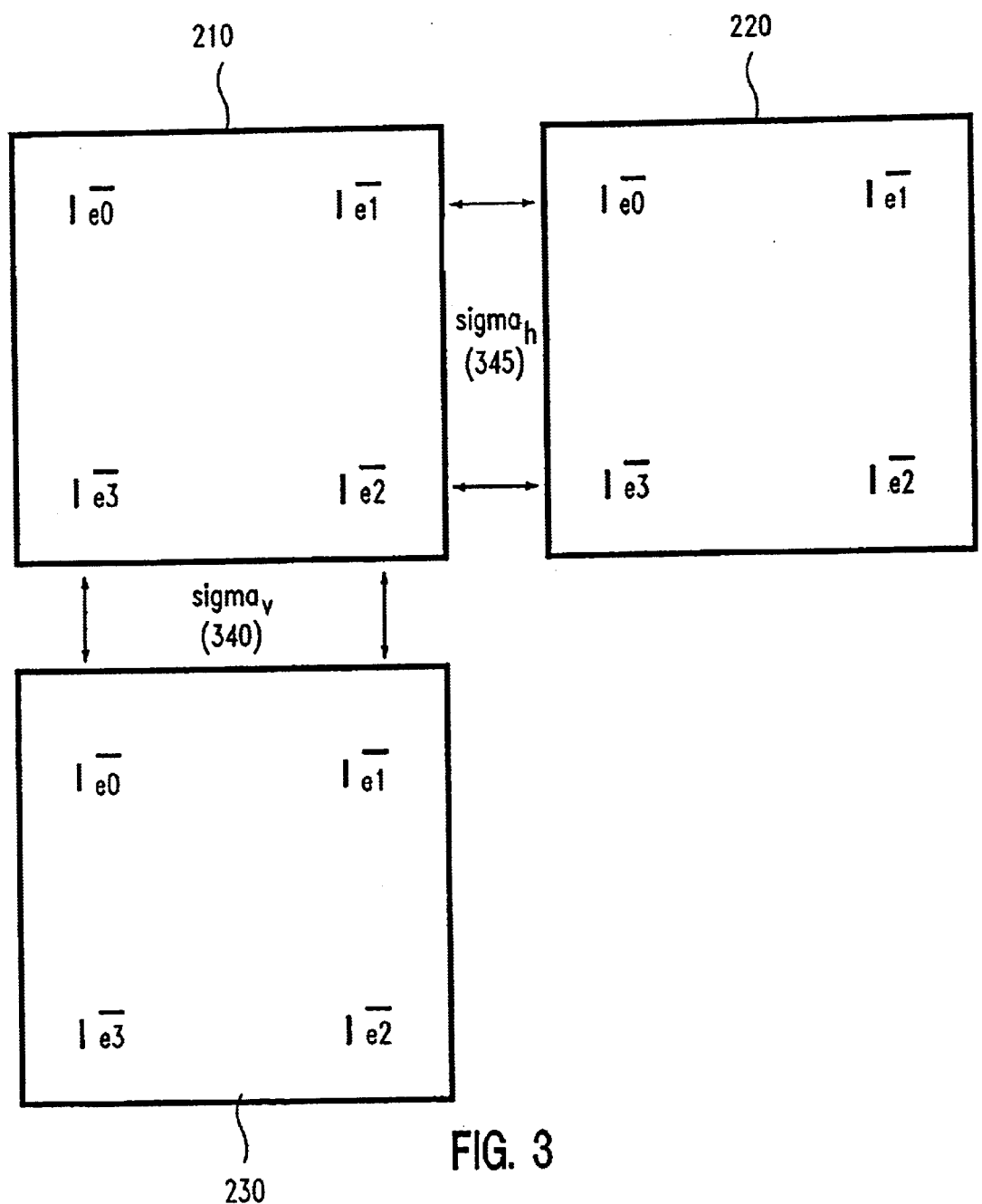
FIG. 3 is an illustration of the calculation of horizontal ($Var_H$) and vertical ($Var_V$) variances using adjacent targets.

In FIG. 3, two more directional variances are shown. These two variance terms are derived from sums of squares as previously used. In this way, the (separated) horizontal variance of the set is comprised of all differences between the measurement at all e1 points and its left neighbor, and e2 and its left neighbor. Similarly, the (separated) vertical variance of the set is comprised of all differences between the measurement at all points e2 and their lower adjacent neighbor, and the measurement at all points e3 and their lower adjacent neighbor.

Figure 5:
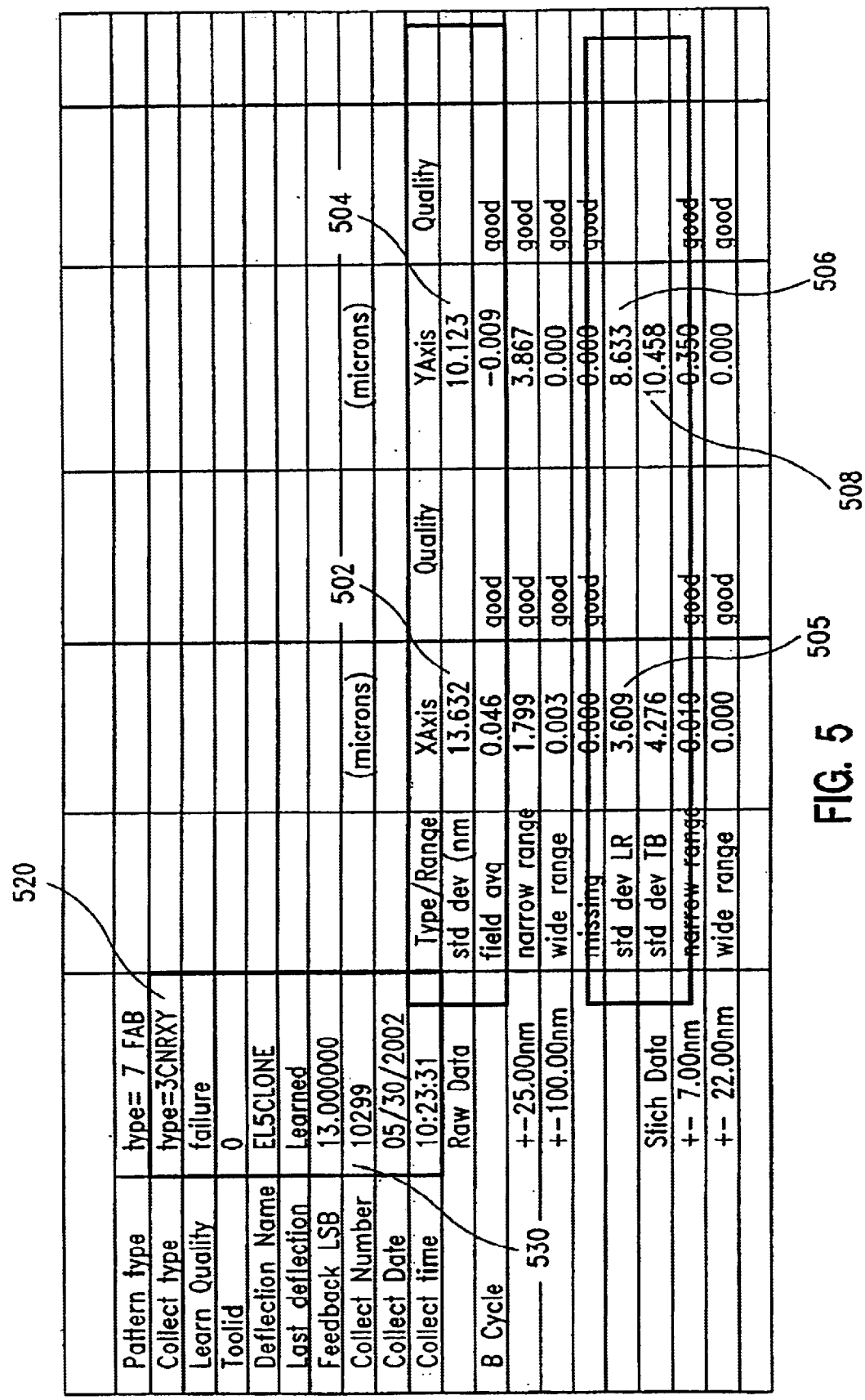
FIG. 5 is an illustration of a statistical example of an alternate data collect used in the present invention.

FIGS. 4 and 5 are two real system examples with the variable(s) measuring also provided.

As a further step, significance tests should now be performed to determine if there exists a difference between the horizontal and vertical points (this is almost a rejection of the null hypothesis that there is no significant difference between horizontal and vertical points). In case of a difference, the data will lead to the conclusion that there may be a problem in the mechanical, or electromechanical beam to mechanical feedback.

We can also refer to the following variance and write them as $Var_{FIELD}$ is the variance of all data in the rastered field $Var_{Stitch\ HV}$ or $Var_{HV}$ is the variance of the all the stitched data with horizontal and vertical data combined.

$Var_{stitch\ H}$ or $Var_H$ is the variance of the all the stitched data with only horizontal stitched data $Var_{stitch\ V}$ or $Var_V$ is the variance of the all the stitched data with only vertical stitched data $Var_{ROW}$ is the variance of the all the data in a raster row.

And lastly $AvgVar_{ROW}$ is the variance of the all the data in a raster row averaged over all rows.

We could also refer to the following standard deviations, which are the square roots of their associated variances:

$StdDev_{FIELD}$ is the standard deviation of all data in the rastered field $StdDev_{STITCH\ HV}$ or $StdDev_{HV}$ is the standard deviation of the all the stitched data with horizontal and vertical data combined.

$StdDev_{LR}$ or $StdDev_{STITCH\ H}$ or $Std_{Dev\ H}$ is the standard deviation of the all the stitched data with only horizontal stitched data $StdDev_{TB}$ $StdDev_{STITCH\ V}$ or $StdDev_V$ is the standard deviation of the all the stitched data with only vertical stitched data $StdDev_{ROW}$ is the standard deviation of the all the data in a raster row.

And lastly, $AvgStdDev_{ROW}$ is the standard deviation of the all the data in a raster row averaged over all rows.

The subscripts H being horizontal, V being vertical, HV being both horizontal and vertical, LR being left-right and the same as H, TB being top bottom and the same as V.

The ratios of several of these variance statistics form F statistics useful for detection of deleterious behavior over a raster row, between rows or over a rastered field.

The F statistic needed for such a test can be provided in several ways. In rejection of the hypothesis that the errors in four corners are not significantly different and to obtain the stitch errors for N subfields with H rows and V columns, the following calculation can be used to obtain the F statistic as follows:

$F_{STITCH}=Var_{FIELD}/Var_{HV}$, with degrees of freedom being 4N, 4N−2H−2V−1.

In rejection of the hypothesis that the stitch errors are not significantly different between horizontal and vertical points, the following two F statistics calculations can be performed:

$F_{HV}=Var_{HV}/\{(Var_H+Var_V)/2\}$ with degrees of freedom being 4N, 4N−2H−2V−2.

Applying the simple ratios obtained in the cases above dialogs, as an example the case collect #10057 (a converged collect) of FIG. 4 can now be used as an example (as shown in (430)).

Here, in the case of X, (and using the values shown (402), (405) and (407)) the $F_{stitch\ hv}$ variance ratios is $3.4^2/[(3.3^2+3.7^2)/2]=0.94$ close to 1, no or little difference.

In the case of Y, (and using values 404 and 408) the $F_{stitch\ hv}$ variance ratio is $6.8^2/[(5.2^2+5.1^2)/2]=1.80$ much greater than 1 and a significant difference between that of the X case.

It should be noted that this case involved a CNR_YX collect (shown at (420)) where there was a move directly before the Y collect but not in the X case. Since the Y case has the greater difference between horizontal and vertical variance and given the degrees of freedom, one can quantify the significance using standard F statistic tables for assumption of independent identically distributed Gaussian noise.

A different example is shown in FIG. 5—a second case— identified with the collect #10299 (a converge collect) as shown at (530). Similar computations can be made using the standard deviations as before.

In the case of X (using (502) and (505)):

$$13.6^2/[3.6^2+10.2^2)/2]=12.33, \text{ a value much greater that } 1$$

In the case of Y, the $F_{stitch\ hv}$ variance ratio is (using (504), (506) and (508))

$$10.123^2/[(8.6^2+10.45^2)/2]=1.11 \text{ about } 1$$

This example provides for a CNR_XY collect (shown at (520) where there was a big move prior to the X collect. There is a significant difference in X and Y case. Given the degrees of freedom, again one can quantify the significance using standard F statistic tables for assumption of independent identically distributed Gaussian noise As a consequence, reviewing the two example cases in FIGS. 4 and 5, it is apparent that in the first case, the corner YX collect had a significance ratio of about 1 for X and 3 for Y where the Y converged collect had the move immediately prior to the taking of the values. Similarly, in the second case, the corner XY had a significant ratio as 12.3 whereas in Y's case the ratio was only about 1. Therefore, the converged collect with the immediate prior move had a large significance result.

Consistent testing shows that these disparities in values are universal. One can therefore make the conclusion that a large ratio indicates something deleterious and that a significant difference between the horizontal stitch and vertical stitch indicates that something had happened immediately prior to a move.

Following the steps outlined above an automated device and method can be devised that can follow the steps outlined above to detect problems and display some measure of the severity of the problem. A combined variance of the displacement of the corners of each subfield to the nominal position could be determined by this method. Additionally, a subfield stitching standard deviation (or variance for that matter) is then determined by calculating the separation of each subfield corner and the overlapping corner on the adjacent subfield. Data is obtained in the X and Y axes separately. Note that the X and Y variances for stitching the left/right subfields and separately for X and Y variances for stitching the top and bottom subfields has to be performed as a step of the automation. The ratios of the Var(x)Var(LR) and Var(TB)/2 for X and a similar one for Y is calculated. If there is a deviation from 1, an error is indicated such as the electron beam column vibrating after a stage move. Similar calculations can be made for three or more dimensional grids and subfields using similar ratios and calculations.

Lastly, we mention that it is possible to use a generic F statistic for detection of electrical noise or mechanic vibrations in raster scanned E beam data, as is useful to detect problems in achieving a flat response over a field. Using standard techniques to calculate variances, we can calculate the variance of the data associated with each raster row where there are X data points per row and call it $Var_{row}$. Likewise, using standard techniques to calculate variances, we can calculate the variance of the data associated with all data in all rows, which is to say all data across the field where there are XY data points over the field, and call it $Var_{field}$. The variance can then be averaged over all rows to get $AvgVar_{field}$. Then, we can use the F statistic formed by the ratio $$F_{rows}=AvgVar_{row}/Var_{field}.$$

which is an F statistic with degrees of freedom of (X-1)Y, XY-1. Significance tables for F statistics, given the degrees of freedom, are well known in statistical literature and can be used to select a threshold which represents a significance based on overkill consideration. The calculated $F_{ROWS}$ may be compared to that threshold, and if $F_{ROWS}$ exceeds the threshold, an error alert can be provided to indicate a problem has occurred in the raster data and quantified by the value $F_{ROWS}$.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method for detecting electromechanical and mechanical errors in a electron beam device, comprising the steps of:
   providing a gridlike subfield where each grid can be considered a target subfield;
   providing a plurality of target points on each target subfield;
   calculating combined variance of displacement of target points on each target subfield to nominal position of said target subfield;
   calculating combined target subfields stitching standard deviation or variance by determining separation of each target point in each subfield with that of overlapping target points on said adjacent subfields grid for measuring combined directional variances;
   completing significance tests for horizontal and vertical values of said target points to calculate separated vertical and horizontal Fstitch values; and
   comparing Fstitch values for horizontal and vertical values and providing an error alert when there is a sufficiently large disparity between said Fstitch values and a ratio of one.

2. The method of claim 1, wherein each target have a plurality of corners and said target points are located on said corners.

3. The method of claim 2, wherein a set of variance statistics and measurements can be obtained for each target point by determining separation of each subfield corner and overlapping corner of adjacent target subfield.

4. The method of claim 3, wherein combined variances are computed for stitching left/right subfields and separately for X and Y variances for stitching top and bottom target subfields.

5. The method of claim 4 wherein the ratio of variances used is Var(X)[Var(Left to Right)=Var(Top to Bottom)/2] for X.

6. The method of claim 4 wherein the ratio of variances used is Var(Y)[Var(Left to Right)=Var(Top to Bottom)/2] for Y.

7. The method of claim 1, wherein F statistic needed for said significance test can be provided for N subfields with H rows and V columns by following formula:

F stitch all=Var all/Var hl , with degrees of freedom being 4N, 4N−2H−2V−1.

8. The method of claim 7, wherein the horizontal and vertical F statistics can be obtained by formulas: F all hv=Var all/[(var h+Var v)/2] with degrees of freedom being 4N, 4N−2H−2V−2; and F stitch hv=Var stitch/[(Var h+var v)/2] with degrees of freedom being 4N, 4N−2H−2V−2.

9. The method of claim 1, wherein severity of said error can also be determined and provided.

10. The method of claim 9, wherein said severity will be determined based on disparity in ratios.

11. The method of claim 10, wherein a greater disparity indicates a more severe problem.

12. A method of detecting electromechanical and mechanical errors in an electron beam device, comprising the steps of:
   providing a three dimensional gridlike subfield where each grid can be considered a target subfield;
   providing a plurality of target points on each target subfield for measuring combined directional variances;
   measuring separated x axis, y axis and z axis variances for said target points;
   completing significance tests for x axis, y axis and z axis values of said target points separately using Fstitch values; and
   comparing Fstitch values for x axis, y axis and z axis values and providing an error alert when there is a large disparity between said Fstitch values and a ratio of one.

13. An apparatus for providing automated detection of electromechanical and mechanical problems in an electron beam device, comprising:
   a gridlike subfield where each grid can be considered a target;
   a plurality of target points provided on each grid for measuring combined directional variances;
   a computational unit for measuring separated horizontal and vertical variances for said target points;
   significance testers for testing horizontal and vertical values of said target points separately and obtaining Fstitch values; and
   a comparator for comparing Fstitch values for horizontal and vertical values and an error alert component for providing an error alert when there is a large disparity between said Fstitch values and a value of one.

14. The apparatus of claim 13, wherein each target has a plurality of corners and said target points are located on said corners.

15. The apparatus of claim 14, wherein a set of variance statistics and measurements can be obtained for each target point by said computational unit and identified as e0, e1, e2, and e3 in each corner.

16. The apparatus of claim 15, wherein combined horizontal and vertical variance comprises of all differences between e1 points and their left neighbor; all differences between all e2 points and their left neighbor which includes differences between all points e2 and all lower adjacent neighbors; and all points e3 and their lower adjacent neighbor and a square root of variance is combined horizontal and vertical statistics.

17. The apparatus of claim 16, wherein a set of said separated horizontal variances is comprised of all differences between measurement at all e1 points and its left neighbor, and e2 and its left neighbor.

18. The apparatus of claim 16, wherein a set of said separated vertical variances is comprised of all differences between measurement at all point e2 and their lower adjacent neighbor, and measurement at all points e3 and their lower adjacent neighbor.

19. The apparatus of claim 13, wherein F statistic needed for said significance test can be provided for N subfields with H rows and V columns by the formula: F stitch all=Var all/Var hv, with degrees of freedom being 4N, 4N−2H−2V−1; and wherein the horizontal and vertical F statistics can be obtained by formulas: F all hv=Var all/[(var h=Var v)/2] with degrees of freedom being 4N, 4N−2H−2V−2; and F stitch hv=Var stitch/[(Var h+var v/2] with degrees of freedom being 4N, 4N−2H−2V−2.

20. The apparatus of claim 13, wherein said apparatus can be used to indicate the severity of said error by amount of disparity measured.

* * * * *